US010249595B2

(12) United States Patent
Danno et al.

(10) Patent No.: US 10,249,595 B2
(45) Date of Patent: *Apr. 2, 2019

(54) METHOD OF MANUFACTURING A SEMICONDUCTOR DEVICE

(71) Applicant: Renesas Electronics Corporation, Koutou-ku, Tokyo (JP)

(72) Inventors: Tadatoshi Danno, Takasaki (JP); Hiroyoshi Taya, Takasaki (JP); Yoshiharu Shimizu, Takasaki (JP)

(73) Assignee: Renesas Electronics Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/729,374

(22) Filed: Oct. 10, 2017

(65) Prior Publication Data

US 2018/0047677 A1 Feb. 15, 2018

Related U.S. Application Data

(60) Division of application No. 15/236,143, filed on Aug. 12, 2016, now Pat. No. 9,806,035, which is a division
(Continued)

(30) Foreign Application Priority Data

Nov. 27, 2003 (JP) .................. 2003-396996

(51) Int. Cl.
*H01L 21/78* (2006.01)
*H01L 21/48* (2006.01)
(Continued)

(52) U.S. Cl.
CPC .......... *H01L 24/83* (2013.01); *H01L 21/4825* (2013.01); *H01L 21/4842* (2013.01);
(Continued)

(58) Field of Classification Search
CPC ........... H01L 21/4821; H01L 23/49861; H01L 23/495; H01L 23/49503; H01L 23/49517;
(Continued)

(56) References Cited

U.S. PATENT DOCUMENTS 5,274,914 A * 1/1994 Kitamura ................ B32B 27/08
257/E23.038
5,853,875 A 12/1998 Toshida et al.
(Continued)

FOREIGN PATENT DOCUMENTS

JP 61-139052 6/1986
JP 61-220361 9/1986
(Continued)

OTHER PUBLICATIONS

Notification of Submission of Opinion dated Mar. 6, 2012 in Korean Application No. 10-2011-0061983.
(Continued)

*Primary Examiner* — Thanhha S Pham
(74) *Attorney, Agent, or Firm* — Shapiro, Gabor and Rosenberger, PLLC

(57) ABSTRACT

A non-leaded semiconductor device comprises a sealing body for sealing a semiconductor chip, a tab in the interior of the sealing body, suspension leads for supporting the tab, leads having respective surfaces exposed to outer edge portions of a back surface of the sealing body, and wires connecting pads formed on the semiconductor chip and the leads. End portions of the suspension leads positioned in an outer periphery portion of the sealing body are unexposed to the back surface of the sealing body, but are covered with the sealing body. Stand-off portions of the suspending leads are not formed in resin molding. When cutting the suspending leads, corner portions of the back surface of the sealing body are supported by a flat portion of a holder portion in a cutting
(Continued)

die having an area wider than a cutting allowance of the suspending leads, whereby chipping of the resin is prevented.

3 Claims, 12 Drawing Sheets

Related U.S. Application Data of application No. 14/702,969, filed on May 4, 2015, now Pat. No. 9,425,165, which is a division of application No. 14/070,676, filed on Nov. 4, 2013, now Pat. No. 9,024,419, which is a continuation of application No. 13/562,639, filed on Jul. 31, 2012, now Pat. No. 8,592,961, which is a continuation of application No. 13/101,199, filed on May 5, 2011, now Pat. No. 8,513,785, which is a continuation of application No. 12/624,309, filed on Nov. 23, 2009, now Pat. No. 8,053,875, which is a continuation of application No. 12/277,144, filed on Nov. 24, 2008, now Pat. No. 7,691,677, which is a continuation of application No. 11/853,798, filed on Sep. 11, 2007, now abandoned, which is a division of application No. 10/983,706, filed on Nov. 9, 2004, now Pat. No. 7,282,396.

(51) Int. Cl.

| | | |
|---|---|---|
| H01L 21/67 | (2006.01) | |
| H01L 23/498 | (2006.01) | |
| H01L 23/495 | (2006.01) | |
| H01L 23/28 | (2006.01) | |
| H01L 23/00 | (2006.01) | |
| H01L 21/56 | (2006.01) | |
| H01L 23/31 | (2006.01) | |
| H01L 23/544 | (2006.01) | |

(52) U.S. Cl.
CPC ........ *H01L 21/565* (2013.01); *H01L 21/6715* (2013.01); *H01L 21/67144* (2013.01); *H01L 21/78* (2013.01); *H01L 23/3107* (2013.01); *H01L 23/3114* (2013.01); *H01L 23/4952* (2013.01); *H01L 23/49503* (2013.01); *H01L 23/49524* (2013.01); *H01L 23/49548* (2013.01); *H01L 23/544* (2013.01); *H01L 23/562* (2013.01); *H01L 24/32* (2013.01); *H01L 24/45* (2013.01); *H01L 24/48* (2013.01); *H01L 24/49* (2013.01); *H01L 24/73* (2013.01); *H01L 2223/54486* (2013.01); *H01L 2224/05554* (2013.01); *H01L 2224/32014* (2013.01); *H01L 2224/32245* (2013.01); *H01L 2224/45144* (2013.01); *H01L 2224/484* (2013.01); *H01L 2224/48091* (2013.01); *H01L 2224/48247* (2013.01); *H01L 2224/48599* (2013.01); *H01L 2224/49171* (2013.01); *H01L 2224/73265* (2013.01); *H01L 2924/01004* (2013.01); *H01L 2924/014* (2013.01); *H01L 2924/01005* (2013.01); *H01L 2924/01006* (2013.01); *H01L 2924/01029* (2013.01); *H01L 2924/01033* (2013.01); *H01L 2924/01046* (2013.01); *H01L 2924/01047* (2013.01); *H01L 2924/01078* (2013.01); *H01L 2924/01079* (2013.01); *H01L 2924/01082* (2013.01); *H01L 2924/12042* (2013.01); *H01L 2924/157* (2013.01); *H01L 2924/181* (2013.01); *H01L 2924/3025* (2013.01); *H01L 2924/3512* (2013.01); *H01L 2924/3701* (2013.01)

(58) Field of Classification Search
CPC . H01L 21/78; H01L 21/4842; H01L 21/4845; H01L 21/6715; H01L 21/565; H01L 23/562; H01L 23/3107; H01L 23/544; H01L 21/4828
See application file for complete search history.

(56) References Cited

U.S. PATENT DOCUMENTS

| | | | |
|---|---|---|---|
| 5,942,794 A | 8/1999 | Okumura et al. | |
| 6,700,186 B2 | 3/2004 | Yasunaga et al. | |
| 6,700,193 B2 | 3/2004 | Shimanuki | |
| 6,710,431 B2 | 3/2004 | Shibata | |
| 6,713,849 B2 | 3/2004 | Hasebe et al. | |
| 6,809,409 B2 | 10/2004 | Fukui et al. | |
| 6,894,376 B1 | 5/2005 | Mostafazadeh et al. | |
| 6,900,524 B1 | 5/2005 | Minamio et al. | |
| 7,282,396 B2 * | 10/2007 | Danno | H01L 21/4842 438/123 |
| 7,321,162 B1 | 1/2008 | Lee et al. | |
| 7,326,041 B2 | 2/2008 | Ochiai et al. | |
| 7,691,677 B2 | 4/2010 | Danno et al. | |
| 7,804,159 B2 | 9/2010 | Shimanuki | |
| 7,833,833 B2 | 11/2010 | Danno et al. | |
| 8,053,875 B2 | 11/2011 | Danno et al. | |
| 8,513,785 B2 | 8/2013 | Danno et al. | |
| 8,592,961 B2 | 11/2013 | Danno et al. | |
| 9,024,419 B2 | 5/2015 | Danno et al. | |
| 9,425,165 B2 | 8/2016 | Danno et al. | |
| 2002/0020929 A1 | 2/2002 | Kasuga et al. | |
| 2002/0084518 A1 | 7/2002 | Hasebe et al. | |
| 2003/0001244 A1 | 1/2003 | Araki et al. | |
| 2003/0001249 A1 | 1/2003 | Shimanuki | |
| 2003/0122225 A1 | 7/2003 | Fukui et al. | |
| 2004/0056337 A1 | 3/2004 | Hasebe et al. | |
| 2005/0186711 A1 | 8/2005 | Yee et al. | |

FOREIGN PATENT DOCUMENTS

| | | |
|---|---|---|
| JP | 06-232195 | 8/1994 |
| JP | 7-235630 | 9/1995 |
| JP | 10-242366 | 9/1998 |
| JP | 11-260983 | 9/1999 |
| JP | 2000-036556 | 2/2000 |
| JP | 2000-091488 | 3/2000 |
| JP | 2000-91488 | 3/2000 |
| JP | 2000-307049 | 11/2000 |
| JP | 2001-127090 | 5/2001 |
| JP | 2001-156239 | 6/2001 |
| JP | 2002-26190 | 1/2002 |
| JP | 2002-026223 | 1/2002 |
| JP | 2002-064114 | 2/2002 |
| JP | 2002-083918 | 3/2002 |
| JP | 2002-118221 | 4/2002 |
| JP | 2002-198482 | 7/2002 |
| JP | 2002-261187 | 9/2002 |
| JP | 2003-031753 | 1/2003 |
| JP | 2003-158234 | 5/2003 |
| JP | 2003-197846 | 7/2003 |
| JP | 2003-332511 | 11/2003 |
| KR | 10-2002-0018686 | 3/2002 |
| KR | 2003-0039314 | 5/2003 |
| WO | WO 01/003186 | 1/2001 |

OTHER PUBLICATIONS

Notification of Submission of Opinion dated Mar. 6, 2012 in Korean Application No. 10-2011-0002527.
Office Action dated Sep. 25, 2012 in Japanese Patent Application No. 2010-008015.
Office Action dated Nov. 8, 2012 in Korean Patent Application No. 10-2011-85661.

(56) References Cited

OTHER PUBLICATIONS

Office Action dated Apr. 15, 2013, in Korean Patent Application No. 10-2013-1922.

* cited by examiner

METHOD OF MANUFACTURING A SEMICONDUCTOR DEVICE

CROSS-REFERENCE TO RELATED APPLICATION

The present application claims priority from Japanese patent application No. 2003-396996 filed on Nov. 27, 2003, the content of which is hereby incorporated by reference into this application.

BACKGROUND OF THE INVENTION

The present invention relates to a semiconductor device and a method of manufacturing the same. Particularly, the present invention is concerned with a technique applicable effectively to improving the quality of a non-leaded semiconductor device.

In the conventional method of manufacturing a resin-sealed type semiconductor device, a sealing sheet is brought into close contact with bottoms of at least lead portions of a lead frame with a semiconductor chip mounted thereon. The sealing sheet is a functional member for protecting the bottoms of the lead portions lest a sealing resin should lap on the lead bottoms and for exposing the lead bottoms as stand-off portions of a desired value (see, for example, Patent Literature 1).

Alternatively, the sealing sheet is a functional member for protecting the bottoms of the lead portions lest a sealing resin should lap on the lead bottoms and for exposing the lead bottoms and bottoms of land electrodes as stand-off portions of a desired value (see, for example, Patent Literature 2).

[Patent Literature 1]
Japanese Unexamined Patent Publication No. 2001-127090 (FIG. 6)
[Patent Literature 2]
Japanese Unexamined Patent Publication No. 2002-26223 (FIG. 6)

SUMMARY OF THE INVENTION

In a non-leaded semiconductor device such as QFN (Quad Flat Non-leaded Package), leads are partially exposed to peripheral edge portions of a back surface of a sealing body, serving as external terminals. Therefore, in resin molding, a sealing sheet is disposed on a die surface of a resin molding die, a lead frame after pellet bonding and wire bonding is disposed on the sealing sheet, and the sealing sheet is put in close contact with a back surface (a part) of each lead. With the sealing sheet, a sealing resin is prevented from adhering to the back surface of each lead, and by allowing each lead to sink into the sealing sheet at the time of injection of the sealing resin, each lead, after formation of a sealing body, is slightly projected from a back surface of the sealing body to ensure a stand-off portion.

Stand-off portions are also formed on the side of suspension leads disposed at corners of the sealing body. Gate resin for resin molding remains on surfaces (upper surfaces) of corner portions of the sealing body in a connected state to the suspension leads. Therefore, at the time of cutting the suspension leads, it is very difficult to dispose a holder portion of a cutting die on the surfaces of the corner portions. For this reason, when cutting the suspension leads, back surfaces of the corner portions of the sealing body are supported by the holder portion of the cutting die and in this state a cutting punch is advanced from the surface side of the sealing body.

At this time, since stand-off portions are also formed on the side of suspension leads, the cutting work is performed while the back surfaces of the corner portions are supported by a cutting die having a holding portion of a shape (e.g., concave shape) which keeps aloof from the stand-off portions. However, when cutting the suspension leads, the sealing body present around the stand-off portions of the suspension leads is apt to contact the holder portion of the cutting die, depending on how variations in the state of resin molding around the stand-off portions and the holder portion of the cutting die are balanced. As a result, when cutting the suspension leads, there arises the problem that the sealing body present around the stand-off portions of the suspension leads comes into contact with the holder portion of the cutting die and causes chipping of resin.

It is preferable that a marking step of marking the name of company and a product code on the surface side of the sealing body be carried out in the state of multiple lead frames before cutting the suspension leads. This is advantageous to the reduction of manufacturing cost. In the foregoing lead cutting step, therefore, multiple lead frames are disposed so that the back side of the sealing body faces up, and in the marking step, multiple lead frames are once turned upside down so that the surface side of the sealing body 3 faces up. When cutting the suspension leads after the marking step, it is necessary to provide a step of again turning the multiple lead frames upside down.

Thus, there is a fear that the assembling throughput may drop, leading to an increase of the manufacturing cost.

For example in case of mounting a semiconductor chip having the same thickness as the thickness of another semiconductor device (e.g., a thin QFP (Quad Flat Package)), a tab (chip mounting portion) and suspension leads are formed thin by half etching so as to be within a restriction in package height of QFN. However, the suspension leads become easier to move because they become thinner and longer, thus giving rise to the phenomenon that the tab shifts toward the back side due to a resin flow pressure at the time of injection of resin in resin sealing.

Consequently, the tab becomes exposed to the back surface of the sealing body or there occurs warping of the sealing body. As a result, there arise problems such as the package height becoming an off-specification height or the occurrence of a poor appearance.

It is an object of the present invention to provide a semiconductor device of improved quality and a method of manufacturing the same.

It is another object of the present invention to provide a semiconductor device improved in packaging performance and a method of manufacturing the same.

The above and other objects and novel features of the present invention will become apparent from the following description and the accompanying drawings.

Typical modes of the present invention as disclosed herein will be outlined below.

In one aspect of the present invention there is provided a semiconductor device comprising a semiconductor chip having on a main surface thereof a semiconductor element and a plurality of electrodes, a sealing body for sealing the semiconductor chip with resin, a chip mounting portion disposed in the interior of the sealing body and connected to the semiconductor chip, suspending leads for supporting the chip mounting portion, a plurality of leads exposed partially to outer edge portions of a back surface of the sealing body and arranged side by side in the outer edge portions, and a plurality of metal thin wires for connecting the plural electrodes of the semiconductor chip and the plural leads corresponding thereto with each other, wherein end portions of the suspending leads positioned in an outer periphery portion of the sealing body are covered with the sealing body on the back surface side of the sealing body.

In another aspect of the present invention there is provided a method of manufacturing a semiconductor device, comprising the steps of providing a lead frame, the lead frame having a chip mounting portion, a plurality of leads arranged around the chip mounting portion and suspending leads for supporting the chip mounting portion; mounting a semiconductor chip onto the chip mounting portion; connecting electrodes formed on the semiconductor chip and the leads corresponding thereto with each other through metal thin wires; disposing the lead frame onto a sealing sheet disposed on a die surface of a resin molding die, thereafter clamping the resin molding die in such a manner that the plural leads of the lead frame come into close contact with the sealing sheet, then sealing the semiconductor chip and the plural metal thin wires with a sealing resin to form a sealing body in such a manner that the sealing resin is allowed to lap over back surfaces of the chip mounting portion and the suspending leads and portions of the back surfaces of the suspending leads corresponding to outer edge portions of the sealing body are covered with the sealing body; and separating the leads and the suspending leads from the lead frame.

Effects obtained by the typical modes of the present invention as disclosed herein will be described below briefly.

Since end portions of the suspending leads positioned in the outer periphery portion of the sealing body are covered with the sealing body on the side of their back surfaces, the suspending leads are not exposed to corner portions of the back surface of the sealing body and stand-off portions are not formed by the suspending leads. Consequently, when cutting the suspending leads, the corner portions of the back surface of the sealing body can be supported by a wide area of a flat portion of a cutting die, whereby it is possible to prevent chipping of resin. As a result, it is possible to improve the quality of the semiconductor device produced.

DETAILED DESCRIPTION OF THE PREFERRED EMBODIMENTS

Figure 1:
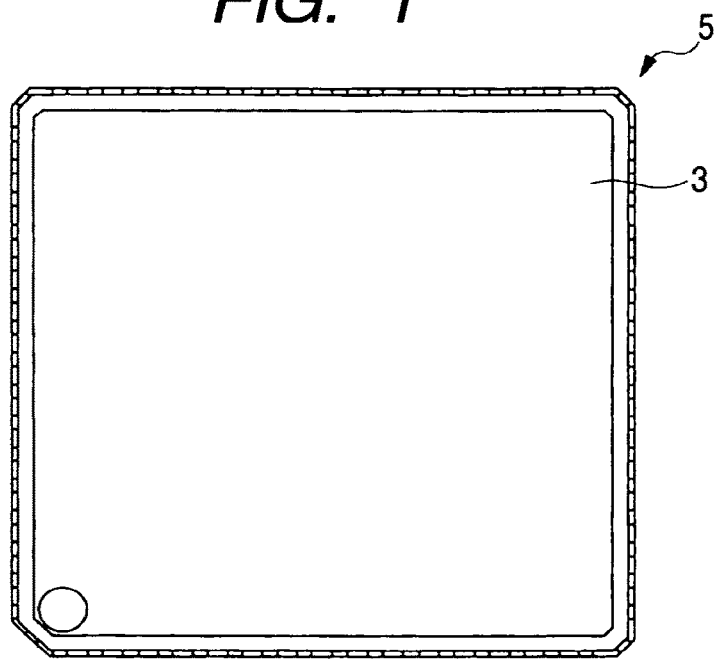
FIG. 1 is a plan view showing the structure of a semiconductor device according to an embodiment of the present invention.

In the following embodiments, as to the same or similar portions, repeated explanations thereof will be omitted in principle except where required.

Where required for convenience' sake, the following embodiments will each be described in a divided manner into plural sections or embodiments, but unless otherwise mentioned, they are not unrelated to each other, but are in a relation such that one is a modification, a detailed description, or a supplementary explanation, of part or the whole of the other.

In the following embodiments, when reference is made to the number of elements (including the number, numerical value, quantity, and range), no limitation is made to the number referred to, but numerals above and below the number referred to will do as well unless otherwise mentioned and except the case where it is basically evident that limitation is made to the number referred to.

Embodiments of the present invention will be described in detail hereinunder with reference to the accompanying drawings. In all of the drawings for explaining the embodiments, members having the same functions are identified by the same reference numerals, and repeated explanations thereof will be omitted in the following description.

Embodiments

Figure 2:
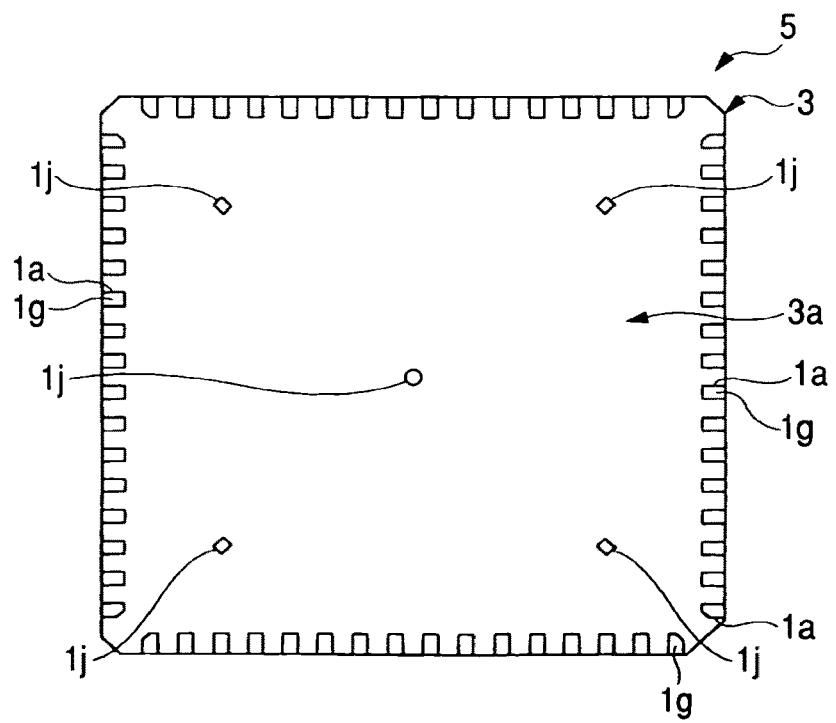
FIG. 2 is a back view thereof.
Figure 3:
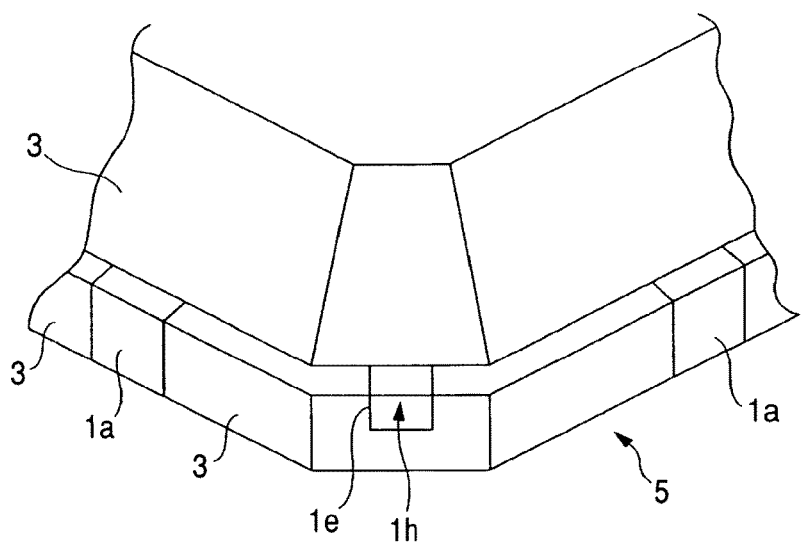
FIG. 3 is a partial enlarged perspective view showing the structure of a corner portion of the semiconductor device of FIG. 1.
Figure 4:
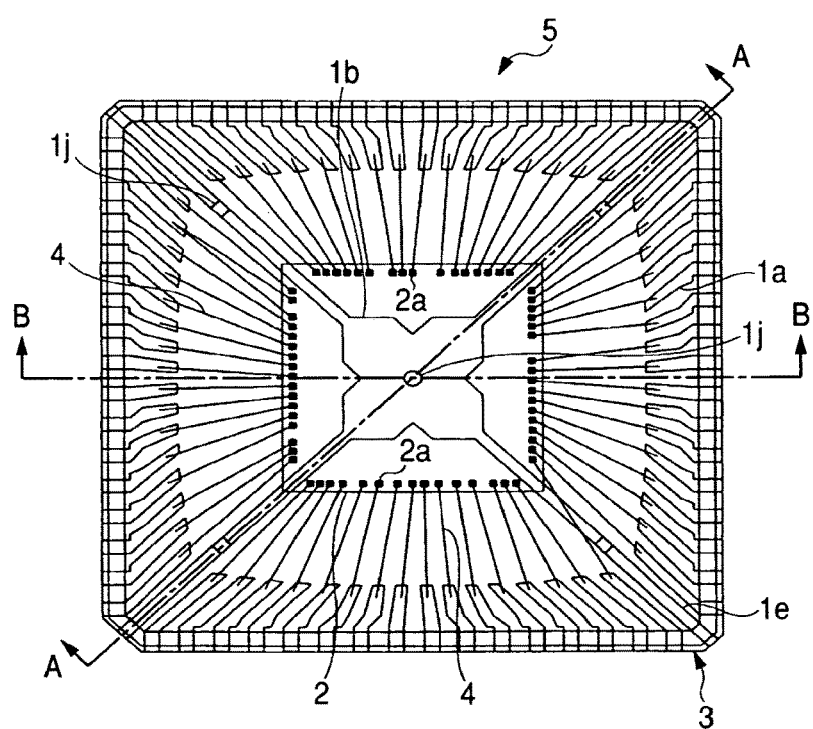
FIG. 4 is a plan view showing the structure of the semiconductor device of FIG. 1 as seen through a sealing body.
Figure 5:
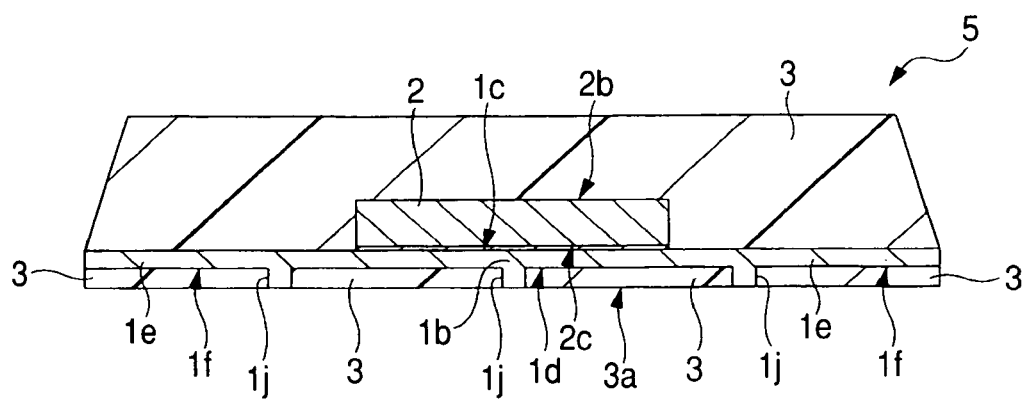
FIG. 5 is a sectional view showing the structure of a section taken along line A-A in FIG. 4.
Figure 6:
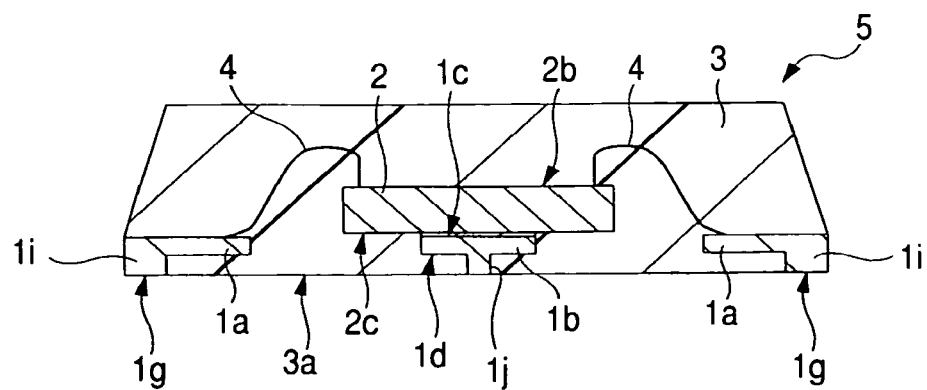
FIG. 6 is a sectional view showing the structure of a section taken along line B-B in FIG. 4.
Figure 7:
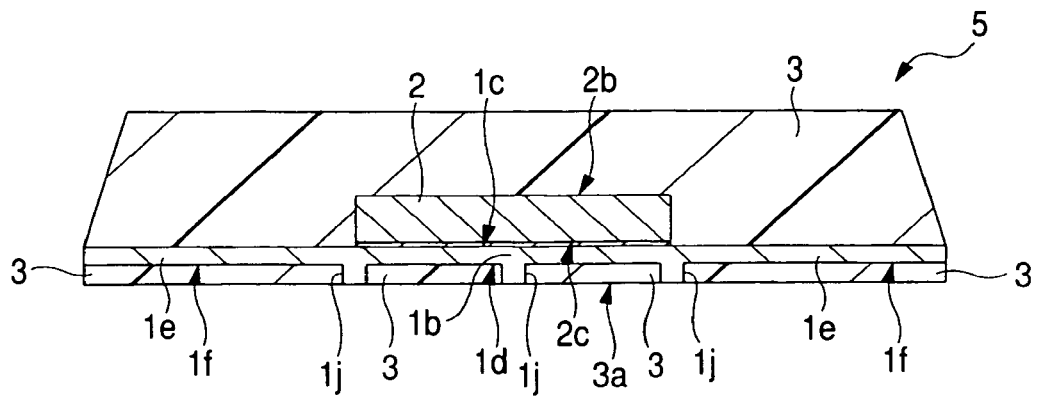
FIG. 7 is a sectional view showing a modification of the structure of the section taken along line A-A in FIG. 4.
Figure 8:
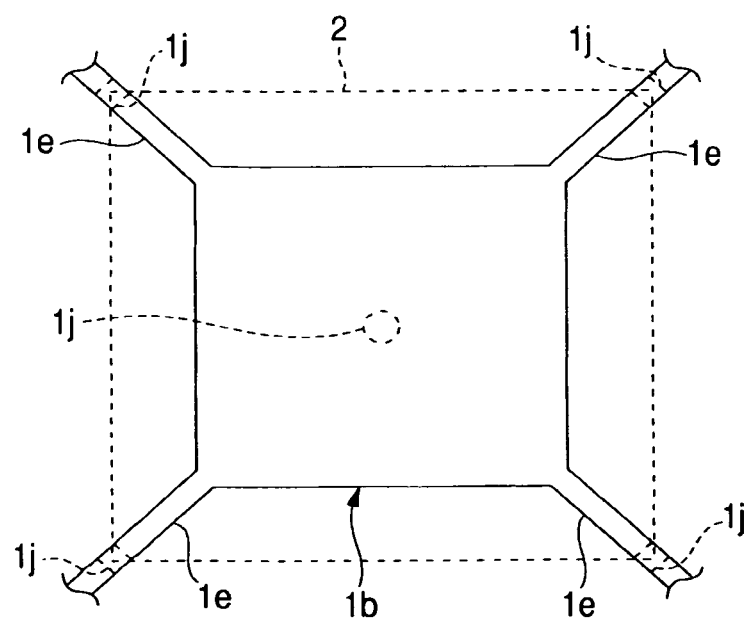
FIG. 8 is a partial enlarged plan view showing the structure of FIG. 7 as seen through the sealing body.
Figure 9:
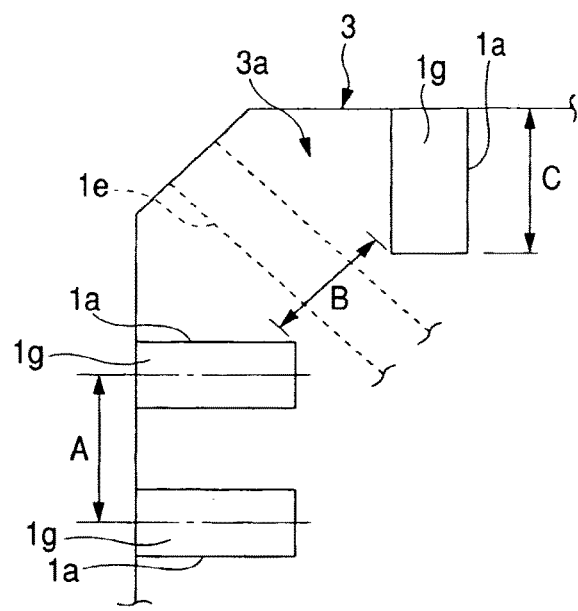
FIG. 9 is a partial enlarged back view showing an example of pin array on a back surface of a corner portion of the semiconductor device of FIG. 1.
Figure 10:
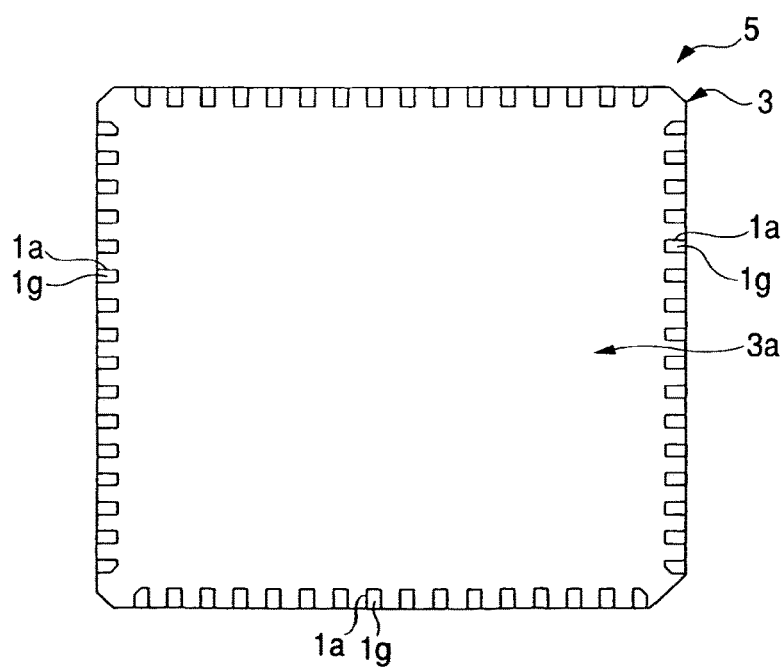
FIG. 10 is a back view showing the structure of a semiconductor device according to a modification of the embodiment of the present invention.
Figure 11:
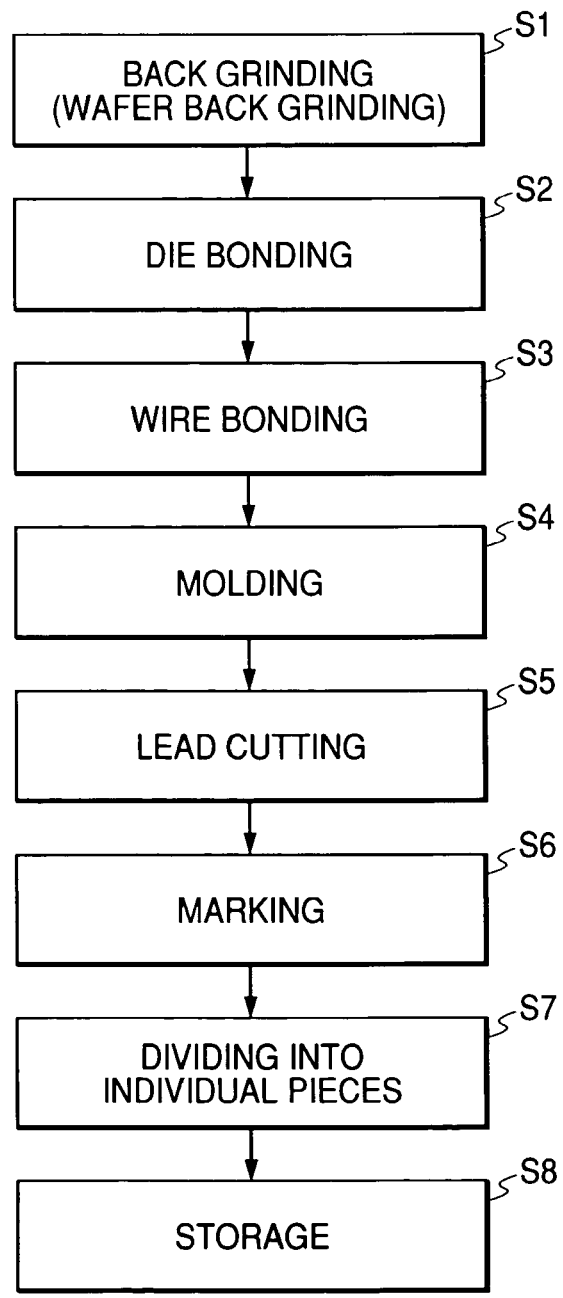
FIG. 11 is an assembling flow chart showing an example of a method of manufacturing the semiconductor device of FIG. 1.
Figure 12:
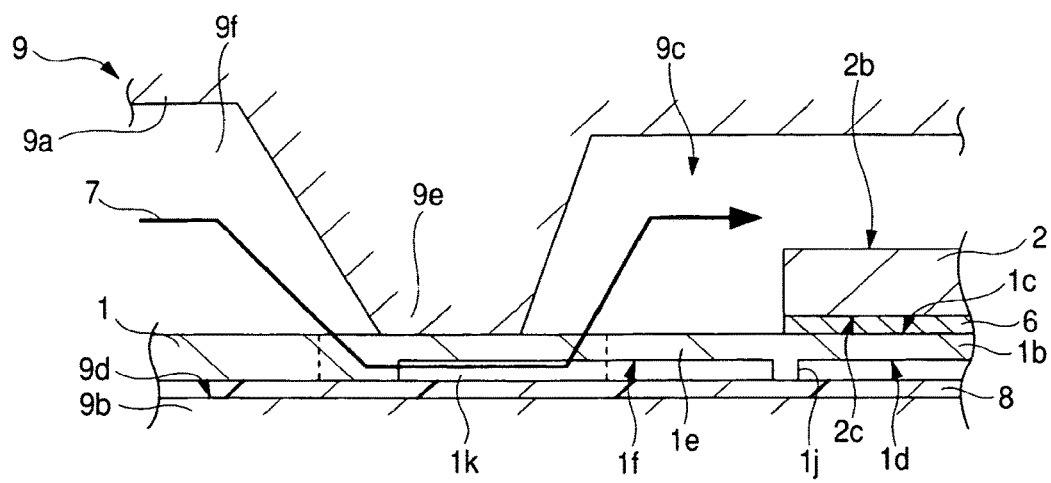
FIG. 12 is a partial sectional view showing an example of a resin injecting method using a plate thickness gate in a molding step in the semiconductor device manufacturing method shown in FIG. 11.
Figure 13:
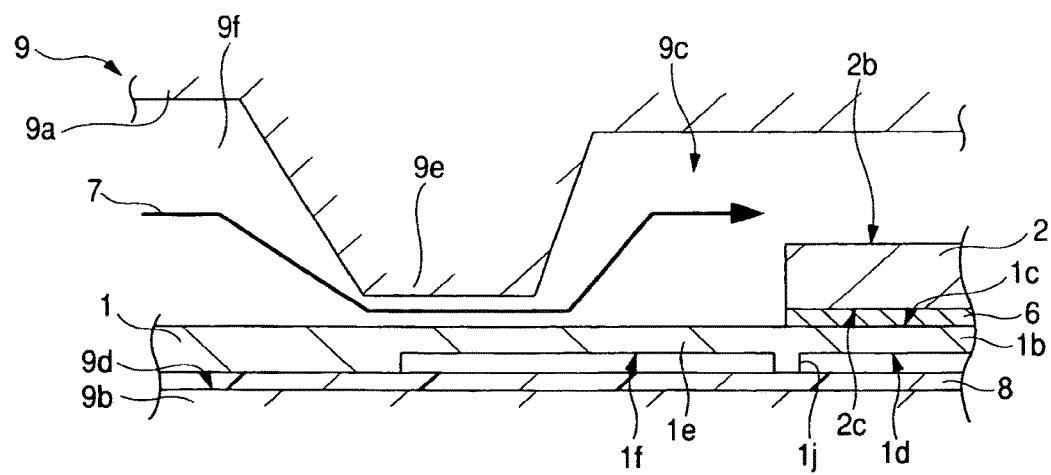
FIG. 13 is a partial sectional view showing an example of a resin injecting method using an ordinary gate in the molding step in the semiconductor device manufacturing method shown in FIG. 11.
Figure 14:
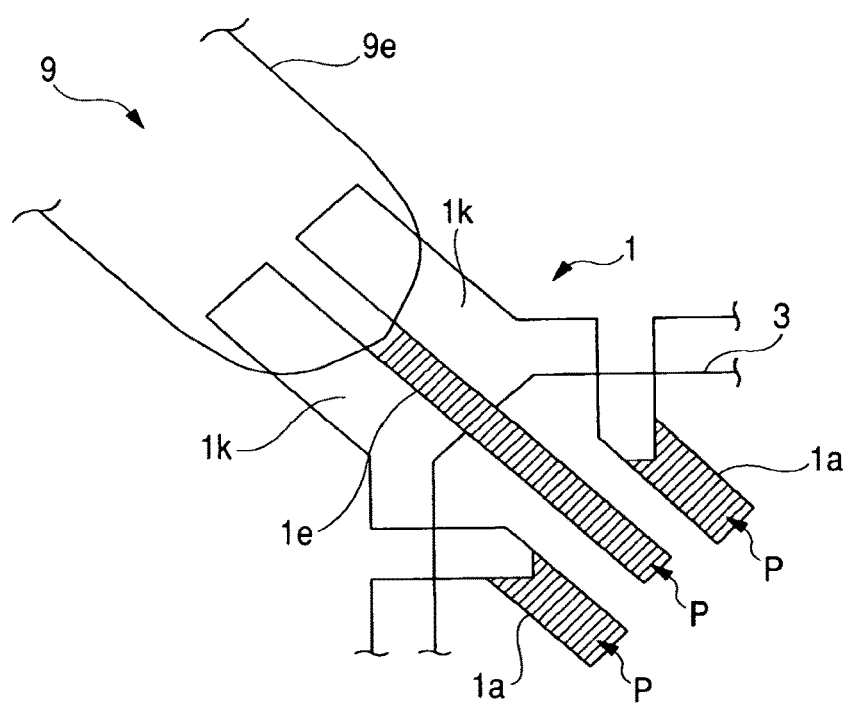
FIG. 14 is a partial enlarged plan view showing an example of a positional relation between a gate and leads in case of using the plate thickness gate shown in FIG. 12.
Figure 15:
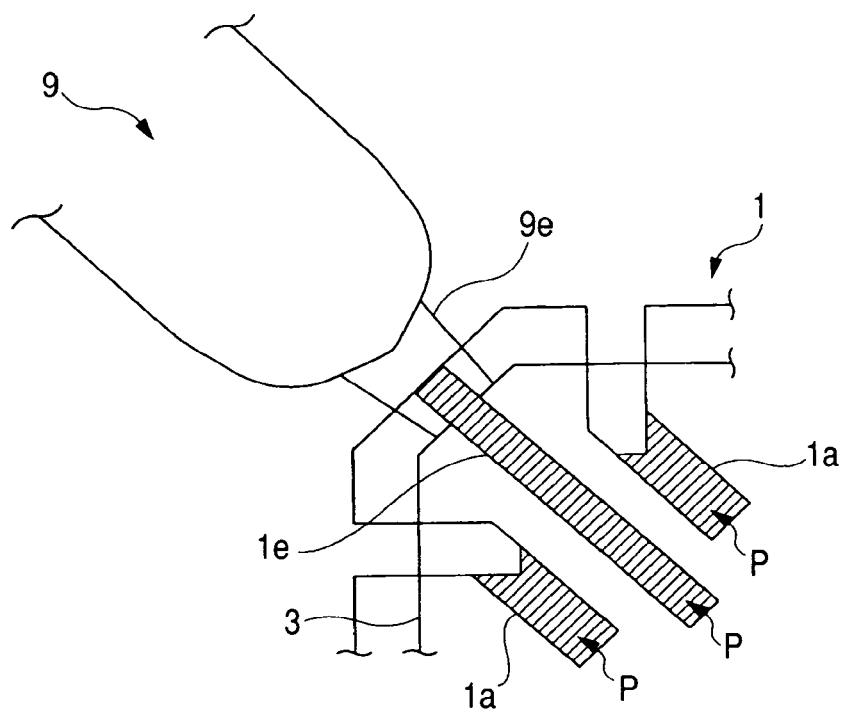
FIG. 15 is a partial enlarged plan view showing an example of a positional relation between a gate and leads in case of using the ordinary gate shown in FIG. 13.
Figure 16:
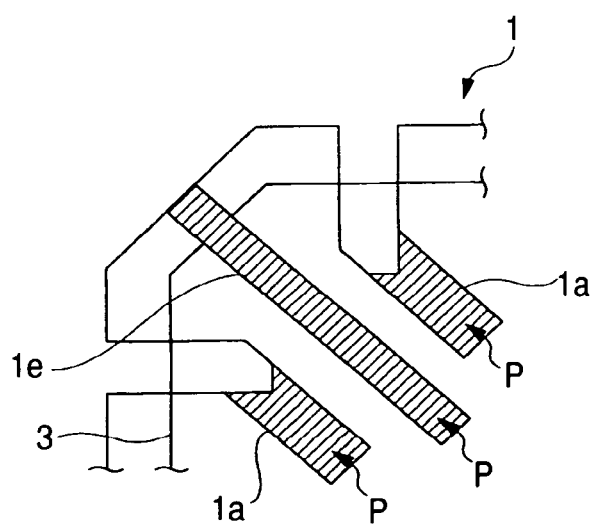
FIG. 16 is a partial enlarged plan view showing the structure of a frame corner portion shown in FIG. 15.
Figure 17:
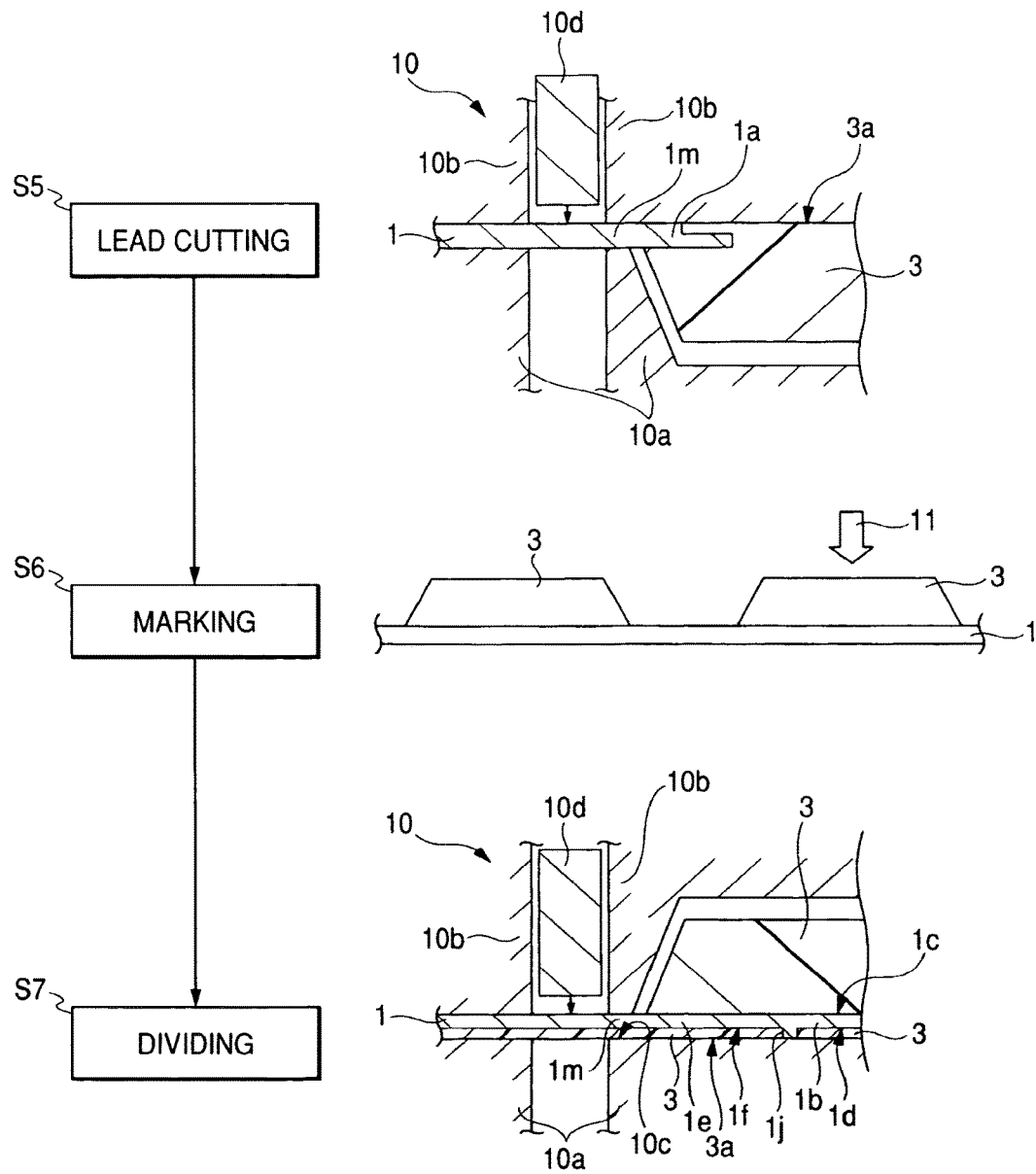
FIG. 17 comprises partial enlarged sectional views and a partial enlarged side view, showing an example of machining states in manufacturing steps from lead cutting to dividing into individual pieces in the semiconductor device manufacturing method shown in FIG. 11.
Figure 18:
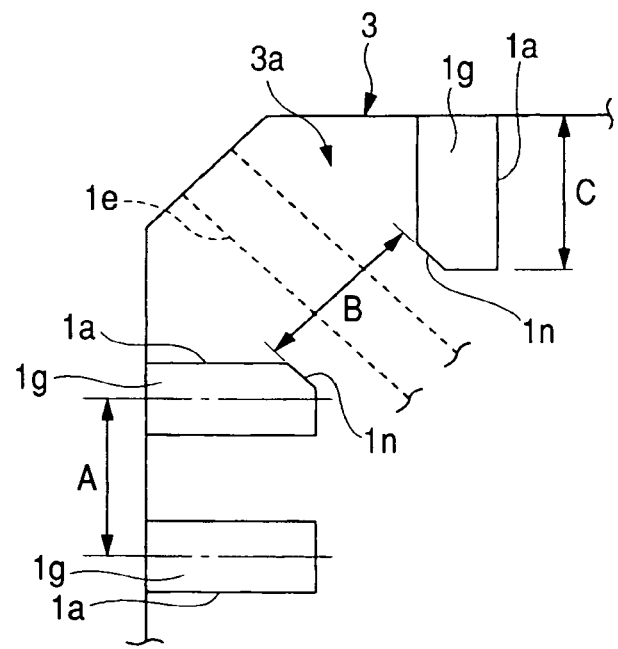
FIG. 18 is a partial enlarged back view showing an example of pin array on a back surface of a corner portion of the semiconductor device of FIG. 1.
Figure 19:
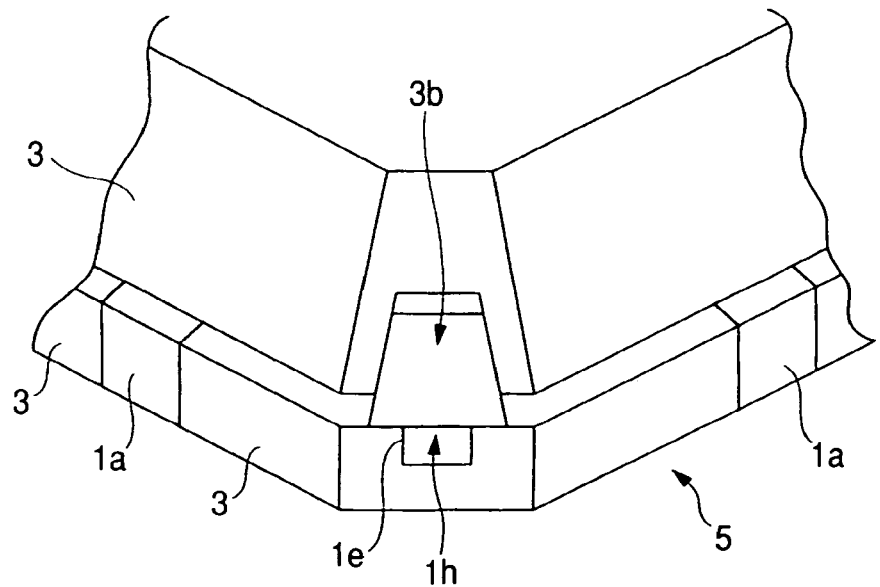
FIG. 19 is a partial enlarged perspective view showing the structure of a corner portion of the semiconductor device in case of using the ordinary gate shown in FIG. 13.

FIG. 1 is a plan view showing the structure of a semiconductor device according to an embodiment of the present invention, FIG. 2 is a back view thereof, FIG. 3 is a partial enlarged perspective view showing the structure of a corner portion of the semiconductor device of FIG. 1, FIG. 4 is a plan view showing the structure of the semiconductor device of FIG. 1 as seen through a sealing body, FIG. 5 is a sectional view showing the structure of a section taken along line A-A in FIG. 4, FIG. 6 is a sectional view showing the structure of a section taken along line B-B in FIG. 4, FIG. 7 is a sectional view showing a modification of the structure of the section taken along line A-A in FIG. 4, FIG. 8 is a partial enlarged plan view showing the structure of FIG. 7 as seen through the sealing body, FIG. 9 is a partial enlarged back view showing an example of pin array on a back surface of a corner portion of the semiconductor device of FIG. 1, FIG. 10 is a back view showing the structure of a semiconductor device according to a modification of the embodiment of the present invention, FIG. 11 is an assembling flow chart showing an example of a method of manufacturing the semiconductor device of FIG. 1, FIG. 12 is a partial sectional view showing an example of a resin injecting method using a plate thickness gate in a molding step in the semiconductor device manufacturing method shown in FIG. 11, FIG. 13 is a partial sectional view showing an example of a resin injecting method using an ordinary gate in the molding step in the semiconductor device manufacturing method shown in FIG. 11, FIG. 14 is a partial enlarged plan view showing an example of a positional relation between a gate and leads in case of using the plate thickness gate shown in FIG. 12, FIG. 15 is a partial enlarged plan view showing an example of a positional relation between a gate and leads in case of using the ordinary gate shown in FIG. 13, FIG. 16 is a partial enlarged plan view showing the structure of a frame corner portion shown in FIG. 15, FIG. 17 comprises partial enlarged sectional views and a partial enlarged side view, showing an example of machining states in manufacturing steps from lead cutting to dividing into individual pieces in the semiconductor device manufacturing method shown in FIG. 11, FIG. 18 is a partial enlarged back view showing an example of pin array on a back surface of a corner portion of the semiconductor device of FIG. 1, and FIG. 19 is a partial enlarged perspective view showing the structure of a corner portion of the semiconductor device in case of using the ordinary gates shown in FIG. 13.

The semiconductor device according to the embodiment shown in FIGS. 1 to 6 is a small-sized, non-leaded semiconductor device in which plural leads 1a are arranged side by side in outer edge portions of a back surface 3a of a sealing body 3. Reference is made to QFN 5 as an example of the semiconductor device of this embodiment.

The QFN 5 comprises a semiconductor chip 2, the semiconductor chip 2 having on a main surface 2b thereof a semiconductor element and plural pads (electrodes) 2a, a sealing body 3 for sealing the semiconductor chip 2 with resin, a tab 1b as a chip mounting portion connected to the semiconductor chip 2, the tab 1b being disposed in the interior of the sealing body 3, suspending leads 1e connected to the tab 1b at corner portions of the tab to support the tab, plural leads 1a arranged side by side in outer edge portions of a back surface 3a of the sealing body 3, the leads 1a having respective to-be-connected surfaces (each being a part of each lead) which are exposed to the said outer edge portions, and plural wires (metal thin wires) 4 for connection between the plural pads 2a formed on the semiconductor chip 2 and the plural leads 1a corresponding thereto. End portions of the suspending leads 1e positioned in an outer periphery portion of the sealing body 3 are covered with the sealing body 3 on the back surface 3a of the sealing body.

That is, as shown in FIG. 2, end portions of the suspending leads 1e are not exposed to corner portions of the back surface 3a of the sealing body 3, but are embedded in the interior of the sealing body 3. However, at each of the corner portions of the sealing body 3, a cut face 1h of each suspending lead 1e is exposed to a side face of the corner portion, as shown in FIG. 3.

Thus, the end portions of the suspending leads 1e positioned in the outer periphery portion of the sealing body 3 are covered with the sealing body 3 on their back surfaces 1f and are not exposed to the corner portions of the back surface 3a of the sealing body 3. According to this structure, stand-off portions of the suspending leads 1e (projecting portions of the leads from the back surface 3a of the sealing body 3) are not formed by resin molding. Consequently, when cutting the suspending leads, as shown in FIG. 17, the corner portions of the back surface 3a of the sealing body 3 can be supported by a flat portion 10c of a holder portion 10a of a cutting die, the flat portion 10c having an area wider than a cutting allowance 1m of each suspending lead 1e. As a result, it is possible to prevent the chipping of resin.

In the QFN 5 of this embodiment, the tab 1b and the suspending leads 1e for supporting the tab are formed thin by half etching for example and are embedded in the interior of the sealing body 3, as shown in FIG. 5. However, projecting portions 1j are formed on back surfaces 1d and 1f of the tab 1b and the suspending leads 1e, respectively, and are exposed to the tack surface 3a of the sealing body 3.

The method for thinning the tab and the suspension leads 1e is not limited to half etching, but there may be adopted any other method than half etching, such as coining for example. In the QFN 5 of this embodiment, the tab 1b and the suspending leads 1e are formed by half-etching the other area than the areas corresponding to their projecting portions 1j in the stage of fabricating the lead frame 1 (see FIG. 12). The areas which have not been subjected to half etching serve as the projecting portions 1j.

Since the projecting portions 1j are thus formed on the back surfaces 1d and 1f of the tab 1b and the suspending leads 1e, even if the tab 1b and the suspension leads 1e are pushed toward the back surfaces under the resin flow pressure at the time of resin injection in resin sealing, the projecting portions 1j come into contact with a film sheet (sealing sheet) 8 on a die surface 9d of a resin molding die 9, as shown in FIG. 12, whereby the tab 1b and the suspending leads 1e are supported by the projecting portions 1j and no longer shift toward the back surfaces. Thus, it is possible to prevent shifting of the tab 1b toward its back surface under the resin flow pressure.

Since the projecting portion 1j on the tab 1b is for supporting the tab 1b at the time of resin injection to prevent the tab from shifting to its back surface side, it is preferable that the projecting portion 1j on the tab be formed centrally of the back surface 1d of the tab 1b, as shown in FIGS. 5 and 6. Plural other projecting portions 1j may be provided around the central projecting portion 1j. However, it is preferable to avoid such arrangement of other projecting portions 1j because wiring is distributed in a layer which underlies the back surface 1d of the tab 1b. As to the tab 1b, it is optional whether a large tab 1b having an area larger than the area of the semiconductor chip 2 is to be used or a small tab 1b having an area smaller than the area of the semiconductor chip 2 is to be used. However, by making area of the tab 1b smaller than that of the semiconductor chip 2, peeling in solder reflow is prevented and stress in temperature cycle is diminished, so that the packaging reliability is improved.

As to the suspending leads 1e, as shown for example in a modification of FIGS. 7 and 8, it is preferable that projecting portions 1j be formed on the back surfaces 1f of the suspending leads at positions corresponding to the corner portions of the semiconductor chip 2. When in addition to those projecting portion 1j there is formed a projecting portion 1j centrally of the back surface 1d of the tab 1b, it follows that projecting portions 1j are exposed at five positions on the back surface 3a of the sealing body 3, as shown in FIG. 2.

Consequently, it is possible to stabilize the location of the tab 1b and prevent tilting of the tab 1b itself.

When the number of pins increases in a multi-pin structure, the pin-to-pin pitch tends to become narrower, so from the standpoint of pin array it is preferable that the suspending leads 1e be not exposed at the corner portions on the back surface 3a of the sealing body 1. For example, in the case of QFN 5 having a package size of 9 mm×9 mm and 64 pins, and given that the pin-to-pin pitch is A, the pin-to-pin distance at a corner portion is B, and the length of a to-be-connected surface as an exposed portion of each lead 1a is C, as shown in FIG. 9, it is preferable to determine those sizes so as to satisfy the relation of A>B>C. Also in this case it is effective to adopt the QFN structure of this embodiment wherein the suspending leads 1e are embedded in the interior of the sealing body 3 at corner portions. As shown in FIG. 18, as the package size becomes smaller with consequent increase in the number of pins and narrowing of the pin-to-pin pitch, the pin-to-pin distance B at each corner portion becomes shorter and therefore it is preferable that suspending lead 1e-side corners of leads 1a located at each corner portion of the back surface 3a of the sealing body 3 be tapered (chamfered) as indicated at 1n.

In the QFN 5 of this embodiment, the tab 1b and the suspending leads 1e need not always be provided with projecting portions 1j, and there may be adopted a structure wherein the tab and the suspending leads 1e are not exposed at all to the back surface 3a of the sealing body 3, as shown in a modification of FIG. 10. According to this structure, the back surfaces 1d and 1f of the tab 1b and the suspending leads 1e are formed thin by half etching and the projecting portions 1j are not provided. Also in this case, since the suspending leads 1e are not exposed to the corner portions of the back surface 3a of the sealing body 3, so that it is possible to prevent chipping of resin when cutting the suspending leads.

In the QFN 5 of this embodiment, as described above, since end portions of the suspending leads 1e located in the outer periphery portion of the sealing body 3 are covered with the sealing body on the back surfaces 1f of the suspending leads, the suspending leads 1e are not exposed to the corner portions of the back surface 3a of the sealing body 3 and therefore stand-off portions are not formed by the suspending leads 1e. Consequently, when cutting the suspending leads, as shown in FIG. 17, the corner portions of the back surface 3a of the sealing body are supported by the flat portion 10c of the holder portion 10a of the cutting die 10 which flat portion 10c has a wider area than the cutting allowance 1m of each suspending lead 1e, whereby it is possible to prevent chipping of resin.

As a result, it is possible to improve the quality of QFN 5.

Moreover, since the suspending leads 1e are not exposed to the corner portions of the back surface 3a of the sealing body 3, in a packaging substrate for packaging the QFN 5, wiring can be distributed in areas corresponding to the corner portions of the back surface 3a of the sealing body 3 and hence it is possible to improve the packaging performance of the QFN 5.

Besides, the projecting portions 1j are provided on at least one or both of the back surface 1d of the tab 1b and the back surfaces 1f of the suspending leads 1e, so even if the tab 1b and the suspending leads 1e are pushed toward the back surfaces of the tab 1b and the suspending leads 1e by the resin flow pressure at the time of resin injection in resin sealing, the projecting portions 1j come into contact with the film sheet 8 on the die surface 9d of the resin molding die 9 to support the tab 1b and the suspending leads 1e, as shown in FIG. 12.

Thus, the tab 1b and the suspending leads 1e are supported by the projecting portions 1j and no longer shift toward their back surfaces, so that it is possible to prevent shifting of the tab 1b toward its back surface under the resin flow pressure. Consequently, exposure to the back surface 1d of the tab 1b and warping of the sealing body 3 can be prevented. Further, it is possible to prevent the height of QFN 5 from becoming an off-specification height or prevent the occurrence of a poor appearance, whereby the quality of QFN 5 can be improved.

As shown in FIG. 12, the semiconductor chip 2 is fixed onto a chip supporting surface 1c of the tab 1b through a die bonding material (e.g., silver paste) 6. A back surface 2c of the semiconductor chip 2 and the chip supporting surface 1c of the tab 1b are connected with each other.

As shown in FIG. 6, the leads 1a arranged side by side in outer edge portions of the back surface 3a of the sealing body 3 in QFN 5 each have a thick-walled portion 1i, a part of which is exposed as a to-be-connected surface 1g to the back surface 3a of the sealing body 3.

An exterior plating such as solder plating or palladium plating is applied to the to-be-connected surface 1g.

The tab 1b, suspending leads 1e and leads 1a are each formed by a thin plate such as a thin copper alloy plate for example.

To match the thinning of the QFN 5, the back surface 2c of the semiconductor chip 2 is subjected to back grinding to a chip thickness of, for example, 0.2 mm (200 μm).

The wires 4 as metal thin wires for connecting the pads 2a of the semiconductor chip 2 and the corresponding leads 1a with each other are, for example, gold wires.

The sealing body 3 is formed by resin sealing in accordance with the molding method. The sealing resin used is, for example, a thermosetting epoxy resin.

Next, a description will be given below of a method of manufacturing the QFN 5 (semiconductor device) of this embodiment with reference to the assembling flow shown in FIG. 11.

In the case where the QFN 5 is fabricated to match the thinning tendency, a back surface of a semiconductor wafer is subjected to back grinding to thin the wafer in step S1. For example, the back grinding is performed so that the wafer thickness becomes 200 μm. However, the back grinding for the semiconductor wafer for the reduction of thickness is not always required.

On the other hand, a lead frame 1 is provided. The lead frame 1 has a tab 1b on which a semiconductor chip 2 can be mounted, plural leads 1a arranged around the tab 1b, and suspending leads 1e for supporting the tab 1b. Back surfaces 1d and 1f of the tab 1b and the suspending leads 1e are formed thin by half etching for example and are respectively provided with projecting portions 1j.

Thereafter, die bonding is performed in step S2. In this die bonding step, the semiconductor chip 2 is fixed through a die bonding material 6 to a chip supporting surface 1c of the tab 1b which is a chip mounting portion of the lead frame 1.

Subsequently, wire bonding is performed in step S3. In this wire bonding step, pads 2a on the semiconductor chip 2 and the corresponding leads 1a are connected together through wires (metal thin wires) 4 such as gold wires.

Then, resin sealing (molding) is performed in step S4. First, as shown in FIG. 12, a film sheet 8 as a sealing sheet is disposed onto a die surface 9d of a lower die 9b in a resin molding die 9. Further, the lead frame 1 is disposed onto the film sheet 8 and thereafter the resin molding die 9 is clamped so that to-be-connected surfaces 1g of the plural leads 1a come into close contact with the film sheet 8.

Subsequently, a sealing resin is allowed to lap on the back surfaces 1d and 1f of the tab 1b and the suspending leads 1e, and the semiconductor chip 2 and the plural wires 4 are sealed with the resin so that the back surface 1d of the tab 1b and the back surfaces 1f of the portions of the suspending leads 1e corresponding to outer edge portions of a sealing body 3, i.e., the back surfaces 1f of end portions of the suspending leads 1e, are covered with the sealing body (sealing resin), to form the sealing body 3.

When injecting the sealing resin into a cavity 9c formed in an upper die 9a of the resin molding die 9, as shown in FIG. 14, a portion of each suspending lead 1e not subjected to half etching and located outside an outer half-etched area (hatched area P in FIG. 14) of an end portion of each suspending lead 1e is pushed down by a gate portion 9e of the resin molding die 9. In this state, the sealing resin is injected into the cavity 9c from gaps 1k each corresponding to the lead thickness and formed on both sides of each suspending lead 1e as in FIG. 14 through a resin injection path 7 extending from a runner 9f to the cavity 9c through the gate portion 9e in FIG. 12, to perform resin sealing.

In this case, since each suspending lead 1e is formed thin by half etching, the gate opening expands and hence it is possible to improve the fluidity of the sealing resin flowing into the cavity 9c.

Further, as shown in FIG. 12, since projecting portion 1j are formed on the back surface 1d of the tab 1b and the back surfaces 1f of the suspending leads 1e, even when the tab 1b and the suspending leads 1e are pushed toward their back surfaces under the resin flow pressure at the time of resin injection, the projecting portions 1j come into contact with the film sheet 8 provided on the die surface 9d of the lower die 9b in the resin molding die 9. As a result, the tab 1b and the suspending leads 1e are supported by the projecting portions 1j and do not shift toward their back surfaces, whereby the tab 1b can be prevented from shifting toward its back surface under the resin flow pressure.

Consequently, exposure to the back surface 1d of the tab 1b and warping of the sealing body 3 can be prevented. Further, it is possible to prevent the height of QFN 5 from becoming an off-specification height or prevent the occurrence of a poor appearance. Thus, the quality of QFN 5 can be improved.

As shown in a modified example of FIGS. 13 and 15, the gate opening may be disposed above the suspending leads 1e to form such a resin injection path 7 as shown in FIG. 13. Also in this case, since the gate opening expands, it is possible to improve the fluidity of the sealing resin flowing into the cavity 9c. In this resin injecting method using the ordinary gate, as shown in FIG. 19, a resin burr 3b is formed on the surface side of each suspending lead 1e after the end of resin molding. When cutting each suspending lead 1e, therefore, the back surfaces of the corner portions of the sealing body 3 are supported by a cutting die 10 and in this state a cutting punch 10d is advanced from the surface side (upper side) of the sealing body 3 to cut the suspending lead 1e.

Therefore, the cutting of each suspending lead 1e can be done using the cutting die 10 provided with a holding portion 10a of a flat surface (flat portion 10c) without forming a concave groove for escape from the resin burr 3b in the holder portion 10a of the cutting die (see FIG. 17).

FIG. 16 shows a positional relation between an outer periphery line of the sealing body 3 defined when sealing is performed by this resin injecting method and a half etching area P (hatched area P in FIGS. 15 and 16) of each suspending lead 1e. Since the half etching area P of the suspending lead 1e extends to both inside and outside of a corner portion of the sealing body 3, it is possible to realize the structure wherein the back surfaces 1f of end portions of the suspending leads 1e are covered with the sealing body 3 (sealing resin).

Thus, since the suspending leads 1e are not exposed to the corner portions of the back surfaces 3a of the sealing body 3, stand-off portions are not formed by the suspending leads 1e.

However, since the resin molding is carried out in a state in which the to-be-connected surfaces 1g of the plural leads 1a other than the suspending leads 1e are put in close contact with the film sheet 8 and are allowed to slightly sink into the film sheet 8, the to-be-connected surfaces 1g of the leads 1a can be projected from the back surface 3a of the sealing body 3 after resin sealing and it is possible to form a stand-off portion in each lead 1a.

After the end of resin sealing, lead cutting is performed in step S5 shown in FIG. 11.

In this lead cutting step, as shown in step S5 in FIG. 17, cutting allowances 1m of the leads 1a are sandwiched and fixed in between holder portions 10a and presser portions 10b of the cutting die 10 while the back surface 3a of the sealing body 3 is allowed to face up. In this state, the cutting punch 10d is advanced from the back surface 3a side (above side) of the sealing body 3 to cut the plural leads 1a.

That is, each lead 1a is formed with a stand-off portion on the back surface 3a side of the sealing body 3 and it is preferable that a lead burr formed on the cut surface of each lead be formed on the surface side of each lead. When cutting the leads, therefore, it is not that the to-be-connected surface 1g as the back surface of each lead 1a is held, but the surface side of each lead is held, and in this state the cutting punch 10d is advanced from the back side (from above) of the leads 1a to cut the leads.

As a result, a lead burr formed on the cut surface of each lead 1a can be formed so as to face the surface side of each lead, whereby when the QFN 5 is soldered to a packaging substrate, it is possible to increase the soldering area.

Thereafter, the manufacturing flow shifts to a marking step S6 shown in FIG. 11. In this marking step, as shown in FIG. 17, first the sealing body 3 is turned upside down so that the surface side of the sealing body 3 faces up. In this state, a desired marking is performed from the surface side of the sealing body 3 by applying, for example, a laser beam 11 to the surface of the sealing body.

Thereafter, the manufacturing flow shifts to a step of dividing into individual pieces shown as step S7 in FIG. 11. In this step, as shown in step S7 in FIG. 17, while allowing the surface of the sealing body 3 to face up, the cutting punch 10d is advanced from the surface side of the sealing body 3 to cut the leads 1e for division into individual pieces. That is, in the QFN 5 of this embodiment, the suspending leads 1e are not formed with stand-off portions, so when cutting the suspending leads, outer edge portions of the back surface 3a of the sealing body 3 corresponding to end portions of the suspending leads 1e can be supported by the flat portion 10c of the holder portion 10a in the cutting die 10 which flat portion 10c has an area sufficiently wider than the cutting allowance 1m of each suspending lead 1e. In this state it is possible to cut the suspending leads.

Consequently, the inverting step which is performed in the use of the plate thickness gate can be omitted and it is possible to prevent the occurrence of resin chipping when cutting the suspending leads in the use of the ordinary gate, whereby the quality of QFN 5 can be improved.

Thus, in assembling the QFN 5 of this embodiment, both marking step and the step of dividing into individual pieces (cutting the suspending leads) can be carried out in a state in which the surface side of the sealing body 3 faces up. Besides, the inverting step of inverting the sealing body 3 so as to let the back surface of the sealing body face up can be omitted. Therefore, it is also possible to use a continuous processing apparatus which can perform both marking operation and suspending lead cutting operation. As a result, it becomes possible to reduce the manufacturing cost.

In the suspending lead cutting step, irrespective of whether the marking step is used or not, the effect of preventing the chipping of resin can be attained by advancing the cutting punch 10d from the surface side of the sealing body 3. However, even if the cutting punch 10d is advanced from the back surface 3a side of the sealing body 3, it is possible to obtain the effect of diminishing the chipping of resin. Therefore, in the case where the marking step is not carried out or is carried out after dividing into individual QFNs 5, the lead cutting and suspending lead cutting step may be carried out while allowing the back surface 3a of the sealing body 3 to face up.

The dividing step by cutting suspending leads is followed by storage shown in step S8 in FIG. 11 to store the QFN 5 in a tray (or a magazine). The procedure may be changed such that the lead cutting and suspending lead cutting step is preceded by the marking step, and after completion of the dividing step, the manufacturing flow shifts to storage shown in step S8 in FIG. 11. However, when the marking step is carried out before the lead cutting step, there is a fear that the mark may be scratched or vanish in washing after the cutting of leads.

Although the present invention has been described above on the basis of embodiments thereof, it goes without saying that the present invention is not limited to the above embodiments, but that various changes may be made within the scope not departing from the gist of the invention.

For example, although reference has been made in the above embodiments to QFN 5 as an example of the semiconductor device according to the present invention, the semiconductor device may be any other semiconductor device than QFN insofar as it is a non-leaded type of a structure wherein end portions of suspending leads 1e are not exposed to corner portions of the back surface 3a of the sealing body 3.

The present invention is suitable for the technique of manufacturing electronic devices and semiconductor devices.

What is claimed is:

1. A method of manufacturing a semiconductor device, comprising the steps of:
   (a) providing an arrangement having a semiconductor chip mounted on a die pad, a suspension lead connected to the die pad, and a lead spaced apart from the die pad and the suspension lead;
   (b) sealing the semiconductor chip, the lead, and the suspension lead;
   (c) after the step (b), cutting the lead with a punch;
   (d) after the step (c), making a mark on a front surface of a sealing body formed by the step (b); and
   (e) after the step (d), cutting the suspension lead with a punch.

2. The method according to claim 1,
   wherein the step (c) is carried out while the sealing body is held face-down.

3. The method according to claim 1,
   wherein, after the step (c) and before the step (d), a washing step of is carried out.

* * * * *